US006842473B2

(12) United States Patent
Porta et al.

(10) Patent No.: US 6,842,473 B2
(45) Date of Patent: Jan. 11, 2005

(54) WATER GETTER DEVICES FOR LASER AMPLIFIERS AND PROCESS FOR THE MANUFACTURE THEREOF

(75) Inventors: Paolo Della Porta, Carimate (IT); Paolo Battilana, Seregno (IT); Luciano Pisoni, Marcallo Con Casone (IT)

(73) Assignee: Saes Getters S.p.A., Lainate (IT)

( * ) Notice: Subject to any disclaimer, the term of this patent is extended or adjusted under 35 U.S.C. 154(b) by 212 days.

(21) Appl. No.: 10/321,312

(22) Filed: Dec. 16, 2002

(65) Prior Publication Data

US 2003/0118065 A1 Jun. 26, 2003

Related U.S. Application Data

(63) Continuation of application No. PCT/IT01/00316, filed on Jun. 15, 2001.

(30) Foreign Application Priority Data

Jun. 16, 2000 (IT) ..................................... MI2000A1365

(51) Int. Cl.[7] .................................................. H01S 3/00
(52) U.S. Cl. ....................................... 372/59; 252/181.7
(58) Field of Search ............................................ 372/59

(56) References Cited

U.S. PATENT DOCUMENTS

| | | | | |
|---|---|---|---|---|
| 3,558,961 A | * | 1/1971 | Palsha | 313/481 |
| 3,560,788 A | * | 2/1971 | Reash et al. | 313/561 |
| 4,229,709 A | * | 10/1980 | McMahan | 372/59 |
| 4,961,040 A | * | 10/1990 | della Porta et al. | 313/561 |
| 5,392,305 A | | 2/1995 | Jakobson | |
| 5,696,785 A | | 12/1997 | Bartholomew et al. | |
| 6,200,494 B1 | * | 3/2001 | Manini et al. | 252/181.7 |

FOREIGN PATENT DOCUMENTS

| | | |
|---|---|---|
| DE | 3913066 A1 | 11/1990 |
| EP | 0 720 260 A1 | 7/1996 |
| EP | 0 960 647 A1 | 12/1999 |
| WO | WO 00/004580 A1 | 1/2000 |

\* cited by examiner

*Primary Examiner*—James Vannucci
(74) *Attorney, Agent, or Firm*—Akin Gump Strauss Hauer & Feld, LLP

(57) ABSTRACT

Water getter devices (10) are provided which comprise a powdered water getter material (18) in a container that is permeable to gases but capable of retaining solid particles and does not need welding. A process for the production of said devices is also provided

16 Claims, 4 Drawing Sheets

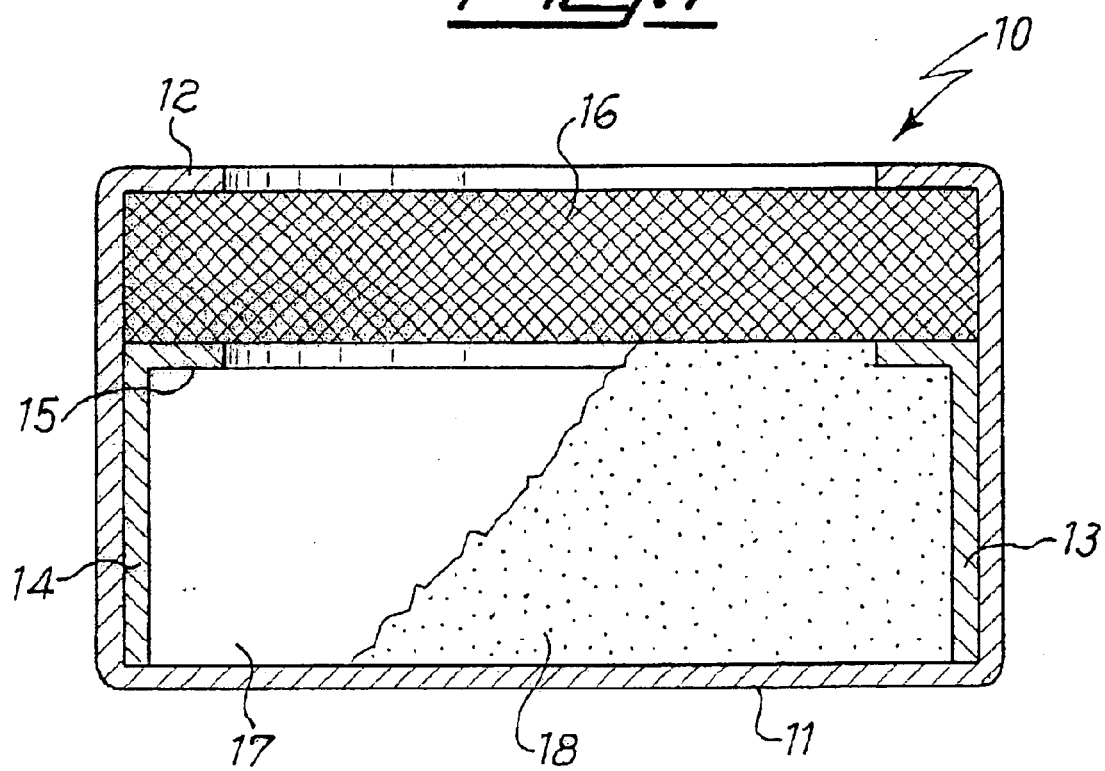
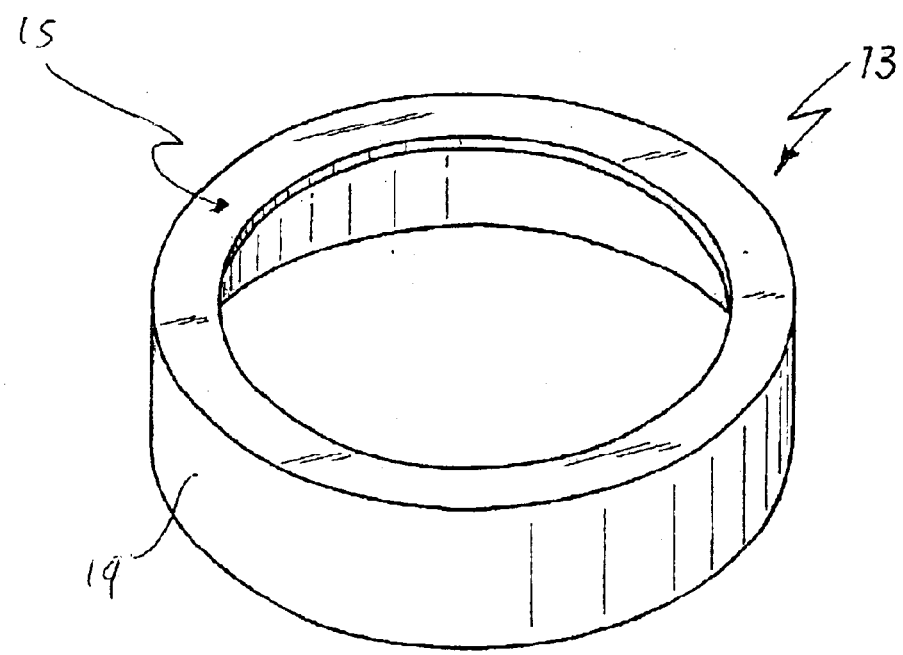

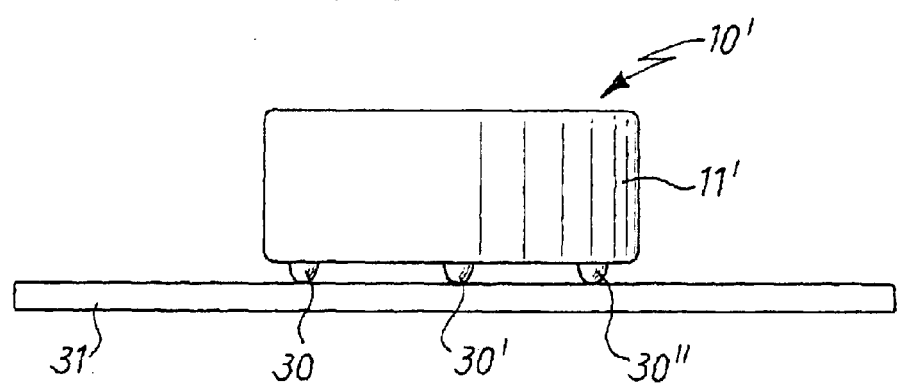
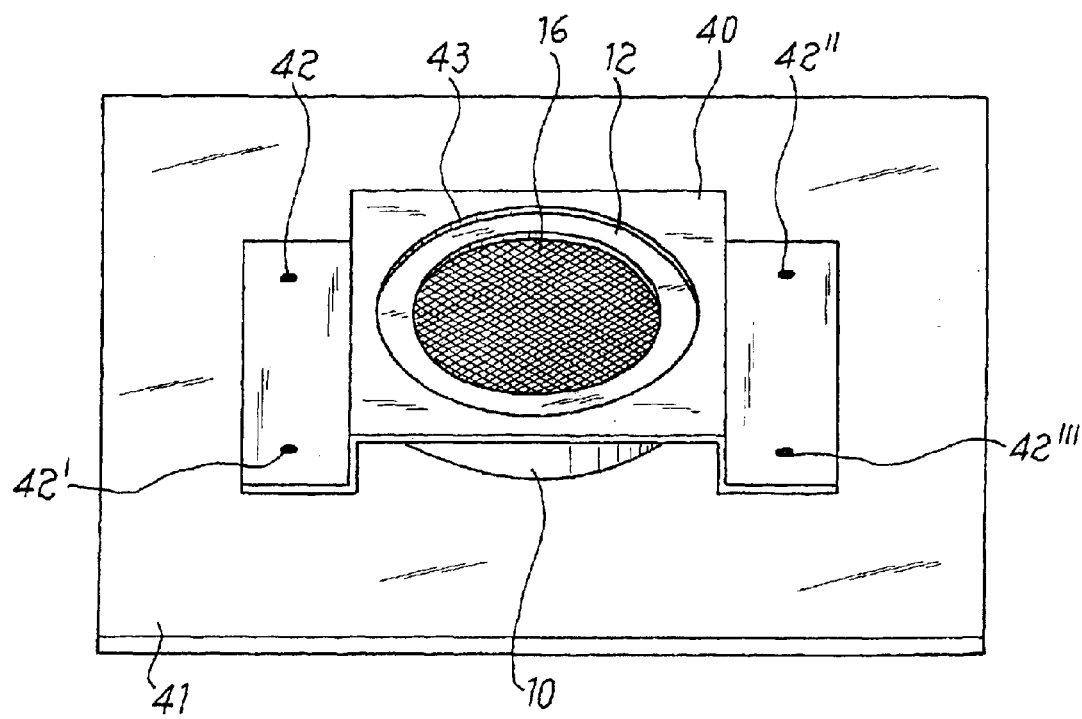

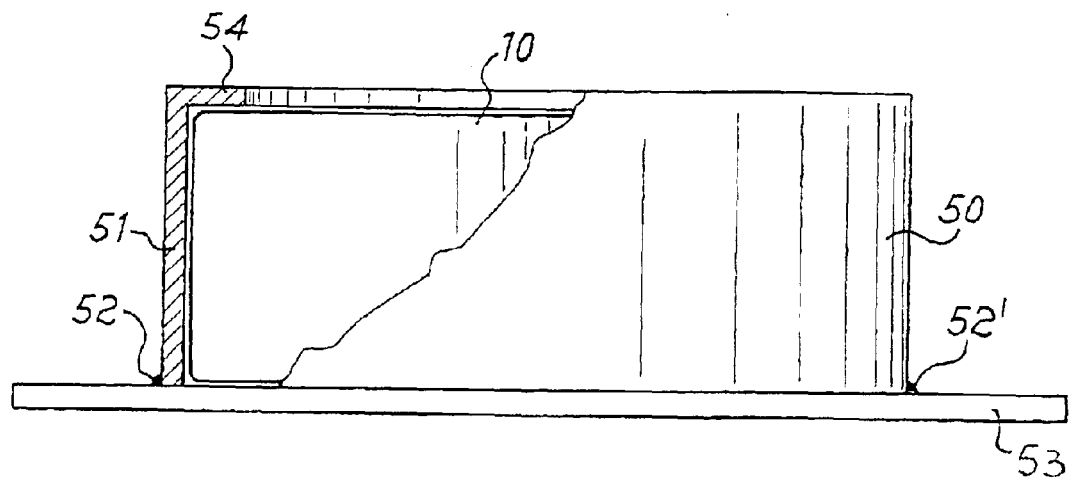
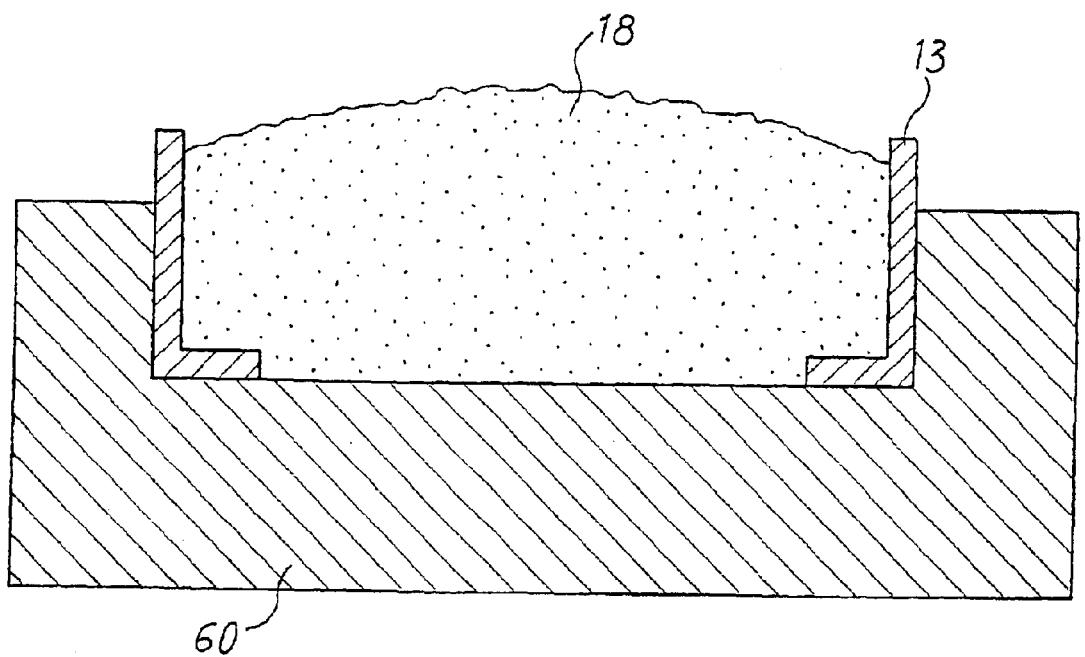

WATER GETTER DEVICES FOR LASER AMPLIFIERS AND PROCESS FOR THE MANUFACTURE THEREOF

CROSS-REFERENCE TO RELATED APPLICATION

This application is a continuation of International Patent Application No. PCT/IT01/00316, filed Jun. 15, 2001, which was published in the English language on Dec. 20, 2001, under International Publication No. WO 01/97348, and the disclosure of which is incoporated herein by reference.

BACKGROUND OF THE INVENTION

The present invention deals with water getter devices for laser amplifiers and a process for the manufacture thereof.

Laser amplifiers are used in the field of telecommunications on optical waveguides. As is known, in such an application the signal is a light pulse traveling along a glass fiber. When traveling along the fiber, the optical signal undergoes attenuation, in consequence of which signal amplifications are needed at given distances, generally comprising between about 50 and 100 km, or at every branching of the line.

To this aim devices are used, which are called optical amplifiers, wherein the signal is brought back to the initial intensity. Generally optical amplifiers comprise electronic components and a laser device, for example a high power gallium arsenide (GaAs) laser, which is the active element in the amplification of an optical signal. The laser device is located in a container having the purpose of keeping under control the gaseous environment around the device itself to ensure its working. In particular, it is necessary to avoid the laser device coming into contact with humidity which could cause either short circuits in the electronics of the device or a corrosion of the materials it is made of.

Water can be present in the container as a residue of the manufacturing process; otherwise it can be produced within the amplifier during its working as a consequence of the reaction between oxygen and the hydrogen released by the walls of the amplifier; or it can even be generated by reaction between traces of organic compounds (such as alcohols or glues, which are utilized in producing the amplifiers) and oxygen. According to the teaching of the U.S. Pat. No. 5,392,305, oxygen is generally added on purpose to the filling atmosphere of the device (generally nitrogen or a rare gas) in a quantity of at least 100 ppm, just in order to remove traces of organic compounds which are known to have a detrimental effect on the amplifier life.

The use of water getter materials in laser amplifiers is described e.g. in the U.S. Pat. No. 5,696,785 that discloses a system for the sorption of various gases among which water, consisting of at least a natural or synthetic zeolite, a compound chosen among porous silica, activated carbon, alumina and some zeolites, and an organic agent with the function of binding the mentioned components. The mixture is compacted by using suitable thermal treatments, with formation of sheets not thicker than one millimeter, which are caused to adhere to one of the inner surfaces of the amplifier container. However the sorption system described in this patent is somewhat complex and there is not specified how it is fixed at the inside of the laser container. Furthermore, with this solution there is even the risk that powders or fragments of the getter material are susceptible of free movements within the laser amplifier container; such particles could interact chemically with or damage mechanically the various components of the amplifier or could also become interposed in an optical path within the device, thus damaging its operation in any case.

European patent application EP-A-720 260 discloses another system for the gas sorption in laser amplifiers. In this case the getter material, in the form of a pellet or a tablet such as according to the above mentioned U.S. Pat. No. 5,696,785 or in the form of loose powders, is provided to be held in a suitable housing and in contact with the gaseous atmosphere within the amplifier, only through a surface permeable to the gases but capable of retaining solid particles. Such a construction should prevent fragments or powders of the getter material from being capable of free movements in the container. The gas permeable surface (such as micro-perforated metal plate) is fixed to the other walls of the getter housing or directly to the wall of the laser device container by means of welding; the welding can be carried out in different ways, e.g., resistance welding or, due to the small sizes involved, laser welding.

To ensure that this system does not lose particles, it is required that the welding is a continuous weld ("continuous seam" welding). However, it is known that a welding with a length of some millimeters or tens of mm are hardly carried out without showing any discontinuity; these discontinuities are critical points for the water getter device, as described in application EP-A-720 260, since they can form ways of passage for the getter material power through which this can reach the inner space of the amplifier with the inconvenience mentioned above. Furthermore, with the "continuous seam" welding scarcely connected burrs are always produce which can detach thus giving the same problems as already discussed for the powers of the getter material.

BRIEF SUMMARY OF THE INVENTION

An object of the present invention is that of providing water getter devices for laser amplifiers which do not show the drawbacks of the prior art, as well as of providing a process for their manufacture.

This and other objects are achieved according to the present invention, which in a first aspect thereof relates to water getter devices formed of:

a metallic container of cylindrical shape with closed bottom, open upwardly and having a mechanical retainer at the upper edge;

an annular metal member with an L-shaped profile being inserted in the container and having a height lower than the latter, with a cylindrical surface having an outer diameter slightly smaller than the inner diameter of the container and with a planar surface facing the inside of the container;

a metallic element being permeable to gases but capable of retaining solid particles, fixed between the planar surface of the metal member with L-shaped profile and the mechanical retainer of the container, which defines a space with the container bottom and the cylindrical wall of the L-shaped member; and a water getter material in the space.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawing:

FIG. 1 is a cross-sectional view of a possible device of the invention;

FIG. 2 is a perspective view of the annular metal member with L-shaped profile being used in the devices of the invention;

FIGS. 3–5 show possible ways of fixing the water getter device of the invention to the inside of a laser amplifier;

FIGS. 6–8 show various intermediate stages or products in obtaining the devices of the invention.

DETAILED DESCRIPTION OF THE INVENTION

Figure 7:
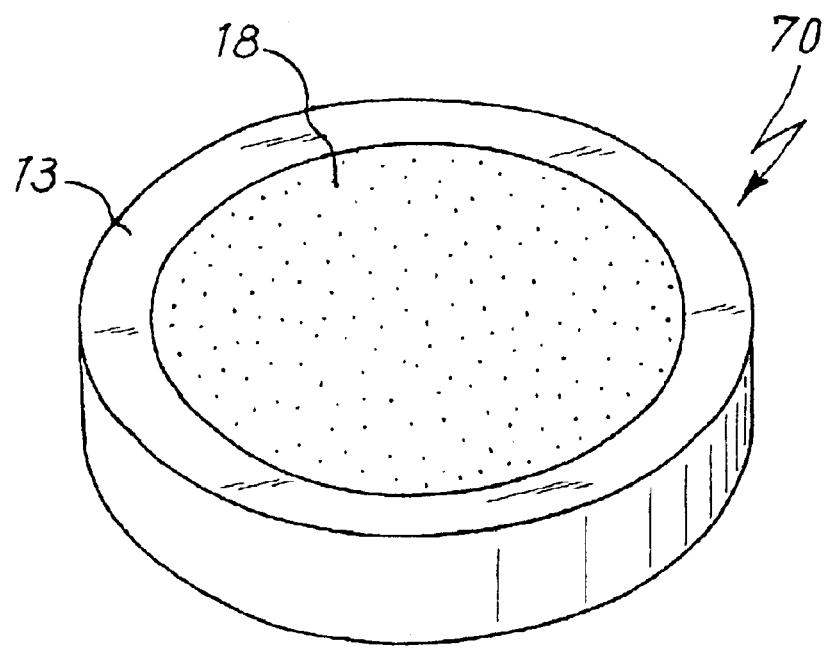

With reference to FIGS. 1 and 2, the device 10 of the invention is formed of a main container 11 within which an annular channel-shaped member 13 is provided with an L-shaped profile; the container 11 has, at the upper edge, a portion 12 forming the above-mentioned retaining element (retainer) and cooperating with the surface 15 of member 13 to keep in position and rigidly fix element 16. Element 16 has the function of allowing gases to pass from the outside to the inner space 17 of the device, which is defined by the inner walls of members 11, 13 and 16, thus preventing at the same time particles of water getter material 18 from leaving said inner space towards the inner space of the amplifier. FIG. 1 shows only a partial filling of space 17 with material 18 to allow a better representation of the space itself, but usually in the devices of the invention the filling of space 17 is total.

Obviously the device 10 may have a different overall size according to the particular laser amplifier for which it is has been designed. Typical dimensions are for example a diameter between 4 and 8 mm and a height between 1.5 and 3 mm.

In a possible alternative embodiment, the device of the invention is provided with a number of elevations on the bottom, which serve for fixing the device to an inner wall of the laser amplifier; this alternative embodiment, shown in the device 10' of FIG. 3, is absolutely similar to the device 10 except for the elevations and will not be described in detail. The elevations on the bottom of device 10' are generally three since, as is well known, this structure allows the best mechanical stability for fixing; preferably the elevations are placed at an angular distance of 120° from each other on the container bottom.

Container 11 is generally obtained by cutting and deep drawing a metal sheet. Generally, sheets of steel are used, which combines features of moldability, mechanical solidity and stainlessness; preferably used is steel AISI 304. The thickness of the sheet, and consequently of the walls of container 11, is typically between about 0.1 and 0.3 mm.

The annular member 13 with L-shaped profile is obtained with the same techniques and materials as for container 11. This member has a cylindrical surface 14 and a planar ring-shaped one 15. This member is generally made with an outer diameter which is smaller than the inner diameter of the container by some hundredths of millimeter, so as to make easier the introduction of member 13 into container 11, while reducing however at a minimum the possibility of free movement of the latter. The height of this member is generally between about 0.5 and 1 mm. The width of surface 15 is determined by a compromise between the needs of providing the element 16 with a stable support and of having the slightest reduction of the gas passage surface towards the water getter material 18; the width typically being about 1 mm.

Element 16 can be whichever metallic element shows a good permeability to gases, but capable of retaining solid particles. It can for example be a metallic plate with microholes, but is preferably a disk of sintered metallic powders, which is usually available in the trade for various applications, mainly in the field of filtration. For the purposes of the invention it is preferred to use septa of sintered steel, such as AISI 316L, with porosity values between about 0.5 and 1 μm: septa with lower porosity size rise to a reduction of gas conductivity and then a reduced sorption speed, and are also more expensive, whereas septa with porosity of larger size could let particles of solid material pass. Element 16 has about the same diameter as that of member 13 and a thickness of some tenths of a mm, generally about 0.5 mm.

The inner space 17 of device 10 is filled with any water getter material 18. It is preferred to use natural or synthetic zeolites, or boron oxide manufactured according to the steps described in the European patent application EP-A-960 647 in the name of the Applicant.

Some possible ways in which a water getter device of the invention can be fixed to an inner wall of a laser amplifier are shown in FIGS. 3–5. The wall to which the device of the invention is fixed is advantageously the lid member closing the amplifier, generally made of Kovar, (an alloy of cobalt, iron and nickel), but other placements are possible as well.

FIG. 3 shows a particular type of device 10' according to the invention, wherein the container, 11' is provided with elevations 30, 30' and 30" on the bottom. The device 10' is fixed to the wall 31 by means of weld spots formed at the elevations.

FIG. 4 shows a device 10 of the invention which is kept in position by means of a metallic member 40, suitably shaped and fixed to the wall 41 with weld spots 42, 42', 42" and 42'"; member 40 shows in its main surface a generally circular opening 43, having a diameter smaller than that of device 10 but such as to partially clear the portion 12 of container 11 and completely clear member 16, so that no reduction in the conveyance of gases towards the water getter material is caused.

Another possible embodiment of retaining member is shown in cross-section in FIG. 5. In this case device 10 is kept in position by an annular member 50 with an L-shaped profile; the member 50 is shown in a partial cutaway view. The base of the cylindrical wall 51 of member 50 is fixed, by means of brazing or weld spots 52, 52', . . . , to the wall 53 of the laser amplifier, while the planar surface 54 of member 50 holds device 10. Similarly to member 40 of the previous Figures, member 50 too is provided with an upper opening with such a diameter as not to obstruct the surface of the element 16 of device 10.

Further embodiments of retaining members similar to 40 or 50, such as a "cage" of metal wires fixed to the wall with weld spots will be apparent to those skilled in the art.

In a second aspect, the invention relates to a process for manufacturing water getter devices as described above.

This process comprises the steps of:

providing an annular member with an L-shaped profile and inserting the same, with the planar surface directed downwards, in a mold of suitable geometry with a closed bottom;

introducing powders of either a water getter material or of a precursor thereof into the cavity formed by the member with L-shaped profile and compressing the powder thus obtaining a pellet of compressed powders, integral with the L-shaped member;

turning the pellet upside down and introducing the same into a cylindrical container with closed bottom having a diameter lightly larger than that of the pellet;

putting into the cylindrical container a metallic element permeable to gases but capable of holding solid particles, laying it onto the pellet, the metallic element having a diameter which is substantially the same as the pellet diameter; and folding the upper edge of the container or portions thereof on the metallic element permeable to the gases.

Figure 8:
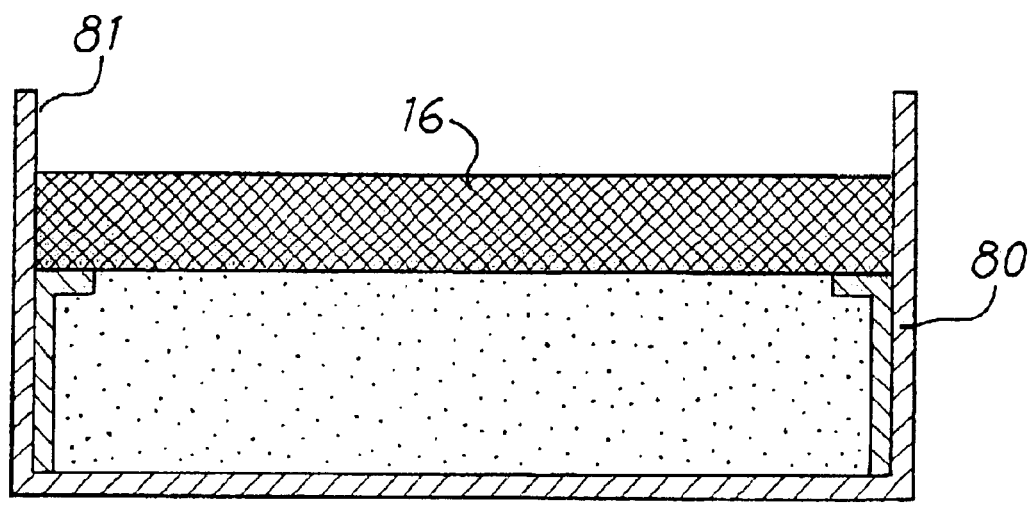

The process is represented in the FIGS. 6–8. In the first step of the process (FIG. 6 in cross-section) the L-shaped member 13 is inserted in a mold 60 with the planar surface downwards, and the hollow thus obtained is filled up to the top with the powdered water getter material 18. Powder 18 is then pressed by a suitable punch and forms with member 13 a single body, thus providing the pellet 70 shown in FIG. 7 overturned with respect to the orientation with which it has been obtained. To ensure the mechanical stability of pellet 70 the powder 18 can be mixed with an additive agent making easier the powder cohesion and its adhesion to the member 13. In case the material 18 is a zeolite, this is preferably used in its moist form with the possible further addition of small quantities of binding, preferably inorganic compounds, such as clays or the like. In case boron oxide is used, this already has compressibility and adhesion features which are suitable to manufacture pellet 70 and does not need the addition of further components. When different materials are used, such as calcium oxide, it is necessary to resort to an inorganic binder, such as kaolin or the like. It is also possible to form the pellet with a precursor of material 18 and then to obtain the material active for water sorption with a subsequent treatment, to be carried out, for example, when the device 10 is ready. For example, in the case of boron oxide being used, pellet 70 can be made with boric acid which then can be thermally decomposed in the finished device thus obtaining the oxide according to the teaching of the cited European patent application EP-A-960 647.

FIG. 8 shows in cross-section a subsequent intermediate stage in the process of manufacturing of device 10, which is obtained after the steps of inserting the pellet 70 into a cylindrical container with closed bottom 80 and subsequent insertion into the container, supported by the pellet 70, of element 16 permeable to gases but capable of retaining solid particles. As seen in the drawing, the pellet 70 is put into container 80 overturned with respect to the orientation of its manufacture. The height of container 80 is greater than the total height of pellet 70 and element 16, whereby the upper portion, 81 of container 80 is protruding with respect to the upper surface of element 16. In the last process step the portion 81 is folded over element 16 and forms the retention member 12, thus obtaining the device 10 of FIG. 1. For folding of portion 81 a set of 3–4 shaped punches is generally used, each giving to portion 81 a partial bending until obtaining an angle of 90°.

The device and process of the present invention show a number of advantages with respect to what was previously known. The device 10 is so constructed that space 17 is completely enclosed by members obtained from mechanical working steps and consequently does not require welding along continuous lines which, as mentioned above, do not guarantee the complete retention of powders and can cause metal fragments to become free deriving from welding burrs. The presence of member 13 forms a shoulder that bears the pressure exerted during the folding of portion 81 over element 16: this avoids mechanical deformations of the overall structure (which are always undesired in the application to electronic devices, wherein narrow dimensional tolerances are generally required), and also avoids the pressure onto element 16 being directly transferred to the powder, which could lead to leakages of the powder itself out of the container during the folding step. The process of the invention reflects the advantages shown by the device, only requiring some simple steps, which can be easily rendered automatic, and avoiding-resort to complex welding steps of extremely high precision to be made on parts of small size. Further, when assembling the pellet 70 in a previous step (and in a chamber different from) that of its introduction into the container, the latter is never exposed to an atmosphere where loose powders are present, which could otherwise adhere to the outer walls thereof and then be released into the amplifier.

It will be appreciated by those skilled in the art that changes could be made to the embodiments described above without departing from the broad inventive concept thereof. It is understood, thereof, that this invention is not limited to the particular embodiments disclosed, but it is intended to cover modifications within the spirit and scope of the present invention as defined by the appended claims.

We claim:

1. A water getter device (10, 10') for laser amplifiers comprising:

a metallic container (11, 11') of cylindrical shape with closed bottom, open upwardly and having a mechanical retainer (12) at its upper edge;

an annular metal member (13) with an L-shaped profile being inserted in the container and having a height lower than the container, with a cylindrical surface (14) having an outer diameter slightly smaller than an inner diameter of the container and with a planar surface (15) facing an inside of the container;

a metallic element (16) being permeable to gases but capable of retaining solid particles, fixed between a planar surface of the metal member with L-shaped profile and said mechanical retainer of the container, which defines a space (17) with the container bottom and a cylindrical wall of the L-shaped member; and a water getter material (18) in said space.

2. The device (10') according to claim 1, wherein the container (11') has a number of elevations (30, 30'30") on its bottom.

3. The device according to claim 2, wherein the elevations on the container bottom are three in number and placed at an angular distance of 120° from each other.

4. The device according to claim 1, wherein the container is manufactured by cutting and punching from a metal sheet.

5. The device according to claim 1, wherein the annular member with L-shaped profile is obtained by cutting and punching from a metal sheet.

6. The device according to claim 1, wherein the metallic element permeable to gases is a porous septum of sintered steel.

7. The device according to claim 6, wherein said porous septum has pores with a size between about 0.5 and $1\mu$ m.

8. The device according to claim 1, wherein the water getter material is a natural or synthetic zeolite.

9. The device according to claim 1, wherein the water getter material is boron oxide.

10. A process for manufacturing a water getter device for laser amplifiers comprising the steps of:

providing an annular metal member (13) with an shaped profile and inserting the same, with its planar surface (15) directed downwards, into a mold (60) of suitable geometry with a closed bottom;

introducing powders of either a water getter material (18) or a precursor thereof into a hollow formed by the member with the L-shaped profile and compressing the powder, thus obtaining a pellet (70) formed of compressed powders which are integral with said L-shaped member;

turning said pellet upside down and introducing it into a cylindrical container (80) having a closed bottom and a diameter slightly larger than that of the pellet;

inserting into the cylindrical container a metallic element (16) permeable to gases but capable of retaining solid particles, laying it onto said pellet, said metallic element having a diameter which is substantially the same as a pellet diameter; and folding down an upper edge (81) of the container or portions thereof onto the gas permeable metallic element.

11. The process according to claim 10, wherein said pellet is formed starting from powdered boron oxide.

12. The process according to claim 10, wherein said pellet is formed starting from powder of the water getter material being mixed with an additive which enhances cohesion of the powder and its adhesion to the L-shaped member (13).

13. The process according to claim 12, wherein the water getter material is a zeolite and the additive is water.

14. The process according to claim 13, wherein a clay is added to the mixture of zeolite and water.

15. The process according to claim 10, wherein said pellet is formed starting from powdered boric acid.

16. The process according to claim 15 wherein the boric acid is thermally decomposed to boron oxide in the final device (10).

* * * * *